(12) United States Patent
Oosterlaken et al.

(10) Patent No.: US 9,410,244 B2
(45) Date of Patent: Aug. 9, 2016

(54) SEMICONDUCTOR PROCESSING APPARATUS INCLUDING A PLURALITY OF REACTORS, AND METHOD FOR PROVIDING THE SAME WITH PROCESS GAS

(75) Inventors: Theodorus G. M. Oosterlaken, Almere (NL); Radko Bankras, Almere (NL)

(73) Assignee: ASM IP HOLDING B.V., Almere (NL)

( * ) Notice: Subject to any disclaimer, the term of this patent is extended or adjusted under 35 U.S.C. 154(b) by 825 days.

(21) Appl. No.: 13/602,713

(22) Filed: Sep. 4, 2012

(65) Prior Publication Data
US 2014/0060430 A1 Mar. 6, 2014

(51) Int. Cl.
C23C 16/455 (2006.01)
C23C 16/44 (2006.01)

(52) U.S. Cl.
CPC ............ *C23C 16/44* (2013.01); *C23C 16/45525* (2013.01); *C23C 16/45561* (2013.01); *Y10T 137/0318* (2015.04); *Y10T 137/85938* (2015.04)

(58) Field of Classification Search
CPC ................................................ C23C 16/45512
See application file for complete search history.

(56) References Cited

U.S. PATENT DOCUMENTS

| 6,843,882 B2 * | 1/2005 | Janakiraman | C23C 16/4412 118/715 |
| 2006/0062900 A1 * | 3/2006 | Selvamanickam | C23C 16/408 427/62 |
| 2006/0090702 A1 * | 5/2006 | Koo et al. | 118/719 |

* cited by examiner

*Primary Examiner* — Parviz Hassanzadeh
*Assistant Examiner* — Nathan K Ford
(74) *Attorney, Agent, or Firm* — Preti Flaherty Beliveau & Pachios LLP

(57) ABSTRACT

A semiconductor processing apparatus is described. The semiconductor processing apparatus includes a gas supply system. The gas supply system has at least one gas supply unit including a process gas source, a gas distribution manifold having an annular gas distribution conduit provided with an inlet and valved outlets; and a gas supply conduit fluidly connecting the process gas source to the inlet of the gas distribution manifold. The semiconductor processing apparatus also includes a plurality of reactors, each fluidly connected to a respective valved outlet of the gas distribution manifold, such that process gas from the process gas source of the at least one gas supply unit is selectively suppliable to a respective reactor via the gas supply conduit, the gas distribution manifold, and a respective valved outlet. A method of providing a plurality of reactors with process gas is also described.

14 Claims, 5 Drawing Sheets

SEMICONDUCTOR PROCESSING APPARATUS INCLUDING A PLURALITY OF REACTORS, AND METHOD FOR PROVIDING THE SAME WITH PROCESS GAS

FIELD OF THE INVENTION

The present invention relates to a gas supply system for a multiple-reactor semiconductor processing apparatus, such as an apparatus for Chemical Vapor Deposition (CVD), and to a multiple-reactor semiconductor processing apparatus provided with such a gas supply system. The present invention also relates to a method of providing the plurality of reactors of a semiconductor processing apparatus with process gas.

BACKGROUND

A semiconductor processing apparatus for the deposition of thin films on semiconductor substrates, such as a CVD-apparatus, a term which in this text may be construed to comprise ALD-apparatus, may typically include a reactor and a gas supply system for the supply of process gases, e.g. precursors, to that reactor. The gas supply system may be complex and expensive, in particular when the process materials/precursors are solid or liquid at about room temperature and thus require melting and/or evaporation, or sublimation before being introduced into the reactor. In case the semiconductor processing apparatus includes a plurality of reactors, the gas supply system may be at least partially shared between the plurality of reactors. Accordingly, savings in both manufacturing and maintenance costs, and in space may be achieved.

When a shared gas supply system is used for a plurality of reactors, the process gases may be supplied to all reactors simultaneously. However, the gas flows to each individual reactor may not be very well controlled. Providing flow control devices for each individual reactor may render the system unduly complicated and expensive. Alternatively, the process gases may be supplied to the plurality of reactors in a sequential way, one reactor at a time. In this way all components of the shared gas source, including eventual flow control components can be shared among the plurality of reactors. In particular for processes using process gas pulses this might be a very economic option. In between gas pulses for one reactor, when the gas supply system is idle or the gas flow is diverted to a vent line or an exhaust, the shared gas supply system may supply gas pulses to another system(s) without (much) loss of process time. However, a common problem with shared gas supply systems is that the plurality of valves, gas line nodes and gas line sections in such a system, required to selectively supply one or more process gases to the various reactors, may retain a certain volume of stagnant fluid. This volume may be referred to as dead volume. A gas supply system inflicted with dead volume may resist effective purging, which may, for instance, cause one reactor to be unintentionally supplied with process gas meant to be supplied to another reactor, or undesired mixing of mutually reactive process gases within the gas lines of the system.

SUMMARY OF THE INVENTION

It is an object of the present invention to provide for a semiconductor processing apparatus with a plurality of reactors and a shared, zero dead volume gas supply system for selectively supplying the plurality of reactors with process gas.

It is another object of the present invention to provide for a zero dead volume gas supply system for use in a semiconductor processing system with a plurality of reactors and capable of selectively supplying the plurality of reactors with process gas.

It is yet another object of the present invention to provide for a method of providing the plurality of reactors of a multiple-reactor semiconductor processing apparatus with process gas.

To this end, a first aspect of the present invention is directed to a semiconductor processing apparatus. The apparatus may include a gas supply system comprising at least one gas supply unit. The at least one gas supply unit may include a process gas source; a gas distribution manifold including an annular gas distribution conduit provided with an inlet and a plurality of valved outlets; and a gas supply conduit that fluidly connects the process gas source to the inlet of the gas distribution manifold. The apparatus may further include a plurality of reactors. Each reactor may be fluidly connected to a respective valved outlet of the gas distribution manifold of the at least one gas supply unit, such that process gas from the process gas source of the at least one gas supply unit is selectively suppliable to a respective reactor of said plurality of reactors via the gas supply conduit, the gas distribution manifold, and a respective valved outlet of the at least one gas supply unit.

A second aspect of the present invention is directed to a gas supply system for use in the semiconductor processing apparatus according to the first aspect of the present invention. The gas supply system may include at least one gas supply unit, which may comprise a process gas source; a gas distribution manifold, including an annular gas distribution conduit provided with an inlet and a plurality of valved outlets, wherein each valved outlet is connectable to one of a plurality of reactors of the semiconductor processing apparatus; and a gas supply conduit fluidly connecting the process gas source to the inlet of the gas distribution manifold. The at least one gas supply unit may be configured such that process gas from the process gas source is selectively suppliable to a respective reactor of said plurality of reactors via the gas supply conduit, the gas distribution manifold, and a respective valved outlet of the at least one gas supply unit.

A third aspect of the present invention is directed to a method of providing a plurality of reactors with a first and a second process gas from a first and a second process gas source, respectively. The method may comprise providing each of the reactors of said plurality of reactors with alternating pulses of the first process gas from the first process gas source and the second process gas from the second process gas source, wherein each of the first and second process gas sources may be in fluid communication with only one reactor at a time. In one embodiment, providing each of the reactors of said plurality of reactors with alternating pulses of the first process gas from the first process gas source and the second process gas from the second process gas source may comprise repeatedly executing an operational cycle comprising a plurality of successive periods, wherein each reactor is exclusively associated with one of said periods of the operational cycle and vice versa, and wherein, during a respective period, pulses of the first and second process gases are selectively and alternately supplied to the reactor associated with said respective period. In another embodiment, providing each of the reactors of said plurality of reactors with alternating pulses of the first process gas from the first process gas source and the second process gas from the second process gas source may comprise repeatedly executing an operational cycle during which each one of the reactors is supplied with alternating process gas pulses from the respective first and second process gas sources, wherein any two consecutive process gas pulses provided from a respective process gas source are supplied to different reactors.

These and other features and advantages of the invention will be more fully understood from the following detailed description of certain embodiments of the invention, taken together with the accompanying drawings, which are meant to illustrate and not to limit the invention.

DETAILED DESCRIPTION

Figure 1:
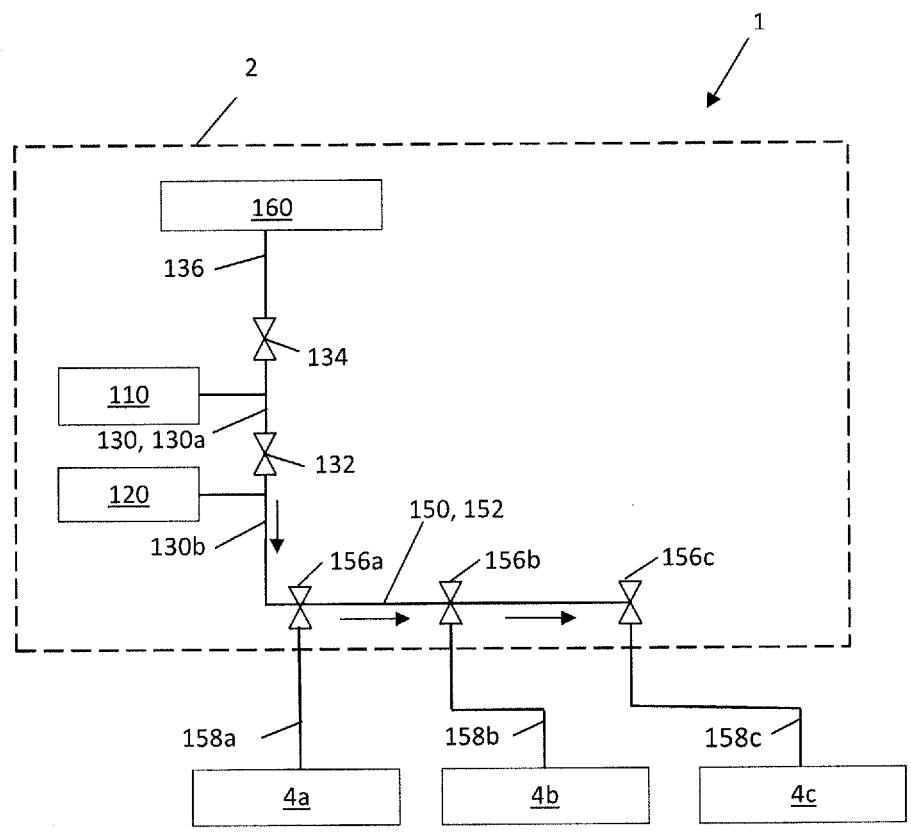
FIG. 1 schematically illustrates a piping diagram of an exemplary, conventional semiconductor processing apparatus including three reactors and a shared gas supply system.

FIG. 1 schematically illustrates a piping diagram of a conventional semiconductor processing apparatus 1. The apparatus 1 includes three reactors 4a-c, and a gas supply system 2 that is shared between the three reactors 4a-c. A problem with the apparatus 1 is that the design of its gas supply system 2 is inflicted with dead volume issues, which will be clarified below through a description of the system's construction and operation.

The gas supply system 2 comprises a process gas source 110 that is fluidly connected to a gas distribution manifold 150 via a gas supply conduit 130. The gas supply conduit 130 includes an upstream stage 130a and a downstream stage 130b. An upstream end of the upstream stage 130a is fluidly connected to the gas supply source 110, while a downstream end of the upstream stage 130a and an upstream end of the downstream stage 130b are communicable with one another through a first gas supply switching valve 132. A downstream end of the downstream stage 130b is fluidly connected to the gas distribution manifold 150, which includes a generally linear gas distribution conduit 152 provided with a plurality of valved outlets 156a-c. Each of the valved outlets 156a-c is fluidly connected to a respective reactor 4a-c via a respective reactor inlet 158a-c, such that the gas distribution manifold is selectively communicable with each of the reactors 4a-c. Besides the process gas source 110, the gas supply system 2 also includes a purge or carrier gas source 120 that is fluidly connected to the downstream stage 130b of the gas supply duct 130. The gas supply system 2 additionally comprises an exhaust 160 which is fluidly connected to the process gas source 110 via the upstream stage 130a of the gas supply conduit 130, and an exhaust conduit 136. The exhaust conduit 136 has an upstream end that is communicable with the upstream stage 130a of the gas supply conduit 130 through a second gas supply switching valve 134, and a downstream end that is fluidly connected to the exhaust 160.

During operation of the apparatus 1, process gas pulses from the process gas source 110 may be selectively supplied to one or more of the reactors 4a-c. Such supply of process gas to selected reactors 4a-c may be initiated by closing the second gas supply switching valve 134, opening the first gas supply switching valve 132, and opening the valved outlet 156a-c associated with the reactors 4a-c that have been selected to be supplied with process gas. As implied by the piping diagram of FIG. 1, the supply of process gas from process gas source 110 to the selected reactors 4a-c may be accompanied by a supply of inert purge gas from purge gas source 120. Once the supply of process gas to the selected reactors 4a-c has been effected for a certain desired pulse duration, the supply may be terminated by closing the first gas supply switching valve 132 and opening the second gas supply switching valve 134, such that the flow of process gas from the process gas supply source 110 is diverted to the exhaust 160 via the exhaust conduit 136. The supply of purge gas from the purge gas source 120 to the reactors 4a-c may be continued until at least the downstream stage 130b of the gas supply duct 130 and the gas distribution manifold 150, and optionally the reactor inlets 158a-c of the previously selected reactors 4a-c are completely purged.

In this respect, it must be noted that effective purging of the gas distribution manifold 150 requires that the valved outlet 156c at the downstream end of the linear gas distribution conduit 152 is in an open state. When, for instance, a pulse of process gas has just been supplied exclusively to reactor 4a, such that valved outlet 156a was necessarily open for at least the duration of the pulse while valved outlets 156b and 156c were closed, the gas distribution conduit 152 holds a large dead volume—extending from valved outlet 156a to the downstream end of the gas distribution conduit 152—that may outgas its contents when reactor inlet 158a is being purged with the valved outlets 156b-c being in a closed state. This results in inadequate purging of gas distribution conduit 152 and reactor 4a. Furthermore, when one of the valved outlets 4b, 4c is opened, reactor 4b, 4c will be unintentionally be exposed to the remaining process gas still present in conduit 152, which is clearly undesirable. For example, in an ALD-apparatus where sequential and alternating pulses of two different process gases are used, a dead volume in the gas distribution conduit 152 may result in the dead volume outgassing or out-diffusing a first reactant gas into a reactor inlet 156a-c that is being purged, such that, when a pulse of a second reactant is supplied to the respective reactor via the purged reactor inlet 156a-c, the two reactants may mix and react within the gas supply system 2.

To prevent the dead volume at the downstream end of the gas distribution conduit 2 from remaining unpurged, one might consider opening the valved outlets 156b and 156c during purging. However, doing so may expose reactors 4b and 4c, and hence any substrates present therein, to process gas in a manner that is unrelated to the use of reactors 4b and 4c. Alternatively, one might consider fluidly connecting the downstream end of the gas distribution conduit 152 to the exhaust 160 or another exhaust, but such an additional connection or exhaust may often render the gas supply system unnecessarily complicated.

Figure 2:
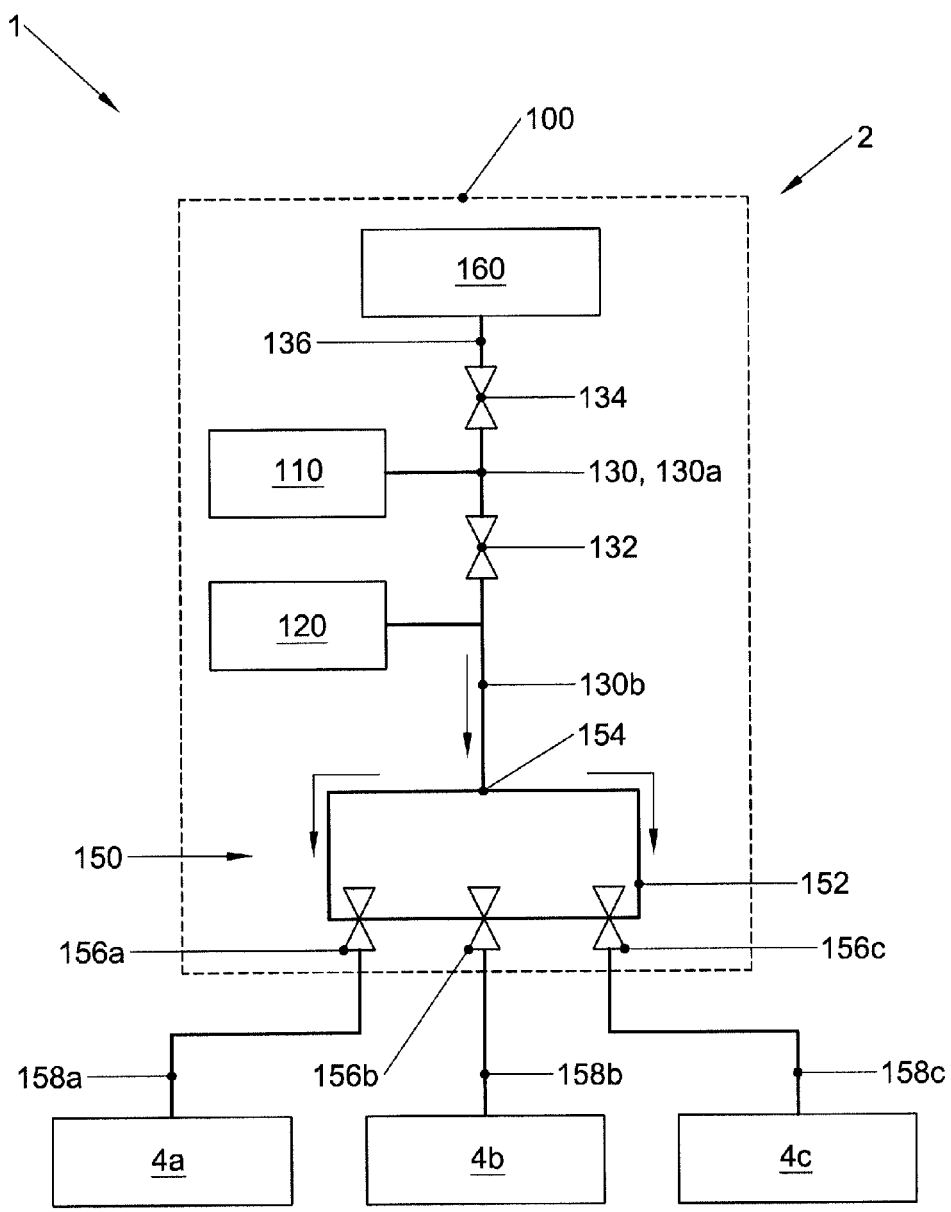
FIG. 2 schematically illustrates a piping diagram of a first exemplary embodiment of a semiconductor processing apparatus according to the present invention, including three reactors and a shared gas supply system including one gas supply unit for selectively supplying a single process gas to said reactors.

FIG. 2 schematically illustrates a piping diagram of a semiconductor processing apparatus 1 according to the present invention. The apparatus 1 includes three reactors 4a, 4b, 4c, and a gas supply system 2 configured to supply these reactors 4a, 4b, 4c with process gas. For the sake of clarity, FIG. 2 indicates parts similar to those shown in FIG. 1 with like reference numerals.

The gas supply system 2 may include at least one gas supply unit 100 configured to selectively supply the reactors 4a-c with a respective process gas. In the embodiment of FIG. 2, the gas supply system 2 includes one gas supply unit 100 for the selective supply of one process gas; an embodiment of the gas supply system 2 including multiple gas supply units 100, 100' for supplying the reactors 4a-c with multiple process gases is discussed below with reference to FIG. 3.

The gas supply unit 100 may generally include a process gas source 110 of any suitable type, e.g. a pressurized gas cylinder, a (gas) bubbler, etc.

The gas supply unit 100 may also include a gas distribution manifold 150. The gas distribution manifold 150 may comprise a gas distribution conduit 152, that is provided with an inlet 154 and a plurality of valved outlets 156a-c. In contrast to the linear gas distribution conduit 152 of the conventional gas supply system 2 illustrated in FIG. 1, the gas distribution conduit 152 of the gas supply system 2 of the apparatus 1 according to the present invention may have an annular configuration, and effectively define a (gas) ring line for the distribution of gas. The inlet 154 of the gas distribution conduit 152 may be fluidly connected to the process gas source 110 through a gas supply conduit 130. Each of the valved outlets 156a-c of the gas distribution conduit 152 may preferably include a controllable zero dead volume valve, having substantially no dead volume in the annular gas distribution conduit 152 upstream of its respective switching point.

At the upstream side of the gas distribution manifold 150, the gas supply conduit 130 may include an upstream stage 130a and a downstream stage 130b. An upstream end of the upstream stage 130a may be fluidly connected to the gas supply source 110, while a downstream end of the upstream stage 130a and an upstream end of the downstream stage 130b may be communicable with one another through a first gas supply switching valve 132. A downstream end of the downstream stage 130b may be fluidly connected to the inlet of the gas distribution manifold 150.

At the upstream side of the gas distribution manifold 150, and fluidly connected to the downstream stage 130b of the gas supply conduit 130, the gas supply system 2 may further provide for a purge gas source 120. The purge gas source 120 may be configured to provide for a pressurized flow of purge or carrier gas, normally a gas that is inert with respect to the process gas provided by the process gas source 110, and in itself be of any suitable type. It is contemplated that other embodiments of the gas supply system 2 may include additional purge gas sources and/or purge gas connections. In one such alternative embodiment, for instance, the purge gas source 120 may additionally be fluidly connected to the reactor inlets 158a-c to be discussed below, such that these reactor inlets 158a-c may be purged when the respective valved outlets 156a-c are closed.

The gas supply unit 100 may additionally comprises an exhaust 160 that is fluidly connected to the process gas source 110 via the upstream stage 130a of the gas supply conduit 130, and an exhaust conduit 136. The exhaust conduit 136 may have an upstream end that is communicable with the upstream stage 130a of the gas supply conduit 130 through a second gas supply switching valve 134, and a downstream end that is fluidly connected to the exhaust 160. The second gas supply switching valve 134 may preferably be a zero dead volume valve, adapted to leave no dead volume between its switching point and the upstream stage 130a of the gas supply conduit 130 when closed.

At the downstream side of the gas distribution manifold 150, each of the valved outlets 156a-c may be fluidly connected to a respective reactor 4a-c via a respective reactor inlet 158a-c. Each of the reactors 4a-c may thus be brought in fluid communication with the manifold volume of the gas distribution manifold 150 by opening the valve of the respective associated valved outlet 156a-c, and be closed off from fluid communication with the manifold volume by closing the valve of the associated valved outlet 156a-c.

Although the number of reactors 4a-c in the embodiment of the semiconductor processing apparatus 1 illustrated in FIG. 2 is three, it is understood that this number may vary for different embodiments, and that the number of valved outlets 156a-c and reactor inlets 158a-c of gas supply unit 100 may vary accordingly.

During operation of the apparatus 1, process gas from the process gas source 110 may be selectively supplied to one or more of the reactors 4a-c. Such supply of process gas may be initiated by closing the second gas supply switching valve 134, opening the first gas supply switching valve 132, and opening the valved outlets 156a-c associated with the reactors 4a-c that have been selected to be supplied with process gas. If desired, the process gas may be supplied to the selected reactors 4a, 4b, 4c in pulses, whose timing may be controlled through the operation of the valves 132, 156a-c in between the process gas source 110 and the respective, selected reactors 4a-c. Along with the process gas from the gas source 110, purge gas may be supplied from purge gas source 120.

When the supply of a pulse of process gas to one or more of the reactors 4a, 4b, 4b is completed, the first gas supply switching valve 132 may be closed and the second gas supply switching valve 134 may be opened, such that process gas may be diverted to the exhaust 160. Meanwhile, the flow of purge gas from the purge gas source 120 may preferably be continued until the downstream stage 130b of the gas supply duct 130 and the gas distribution manifold 150 have been completely purged.

For instance, when process gas has been supplied exclusively to reactor 4a, with valved outlet 156a open and valved outlets 156b and 156c closed, the manifold volume of the gas distribution manifold 150 may be effectively purged from its inlet 154 through both branches of the annular gas distribution conduit 152, to valve 156a.

When a sequence of pulses is supplied to one or more of the reactors 4a-c by repeatedly switching at least the first and second gas supply switching valves 132, 134, a continuous flow of process gas may be maintained during the entire sequence of pulses, the flow being diverted to the exhaust 160 when it is not supplied to a reactor 4a-c, and vice versa. Alternatively, depending on the circumstances, such as the desired length of the pulses, the flow rate of process gas may be temporarily reduced or even completely switched off in between different pulses. During the supply of a sequence of process gas pulses, a continuous flow of purge gas may still be supplied from source of purge gas 120.

Figure 3:
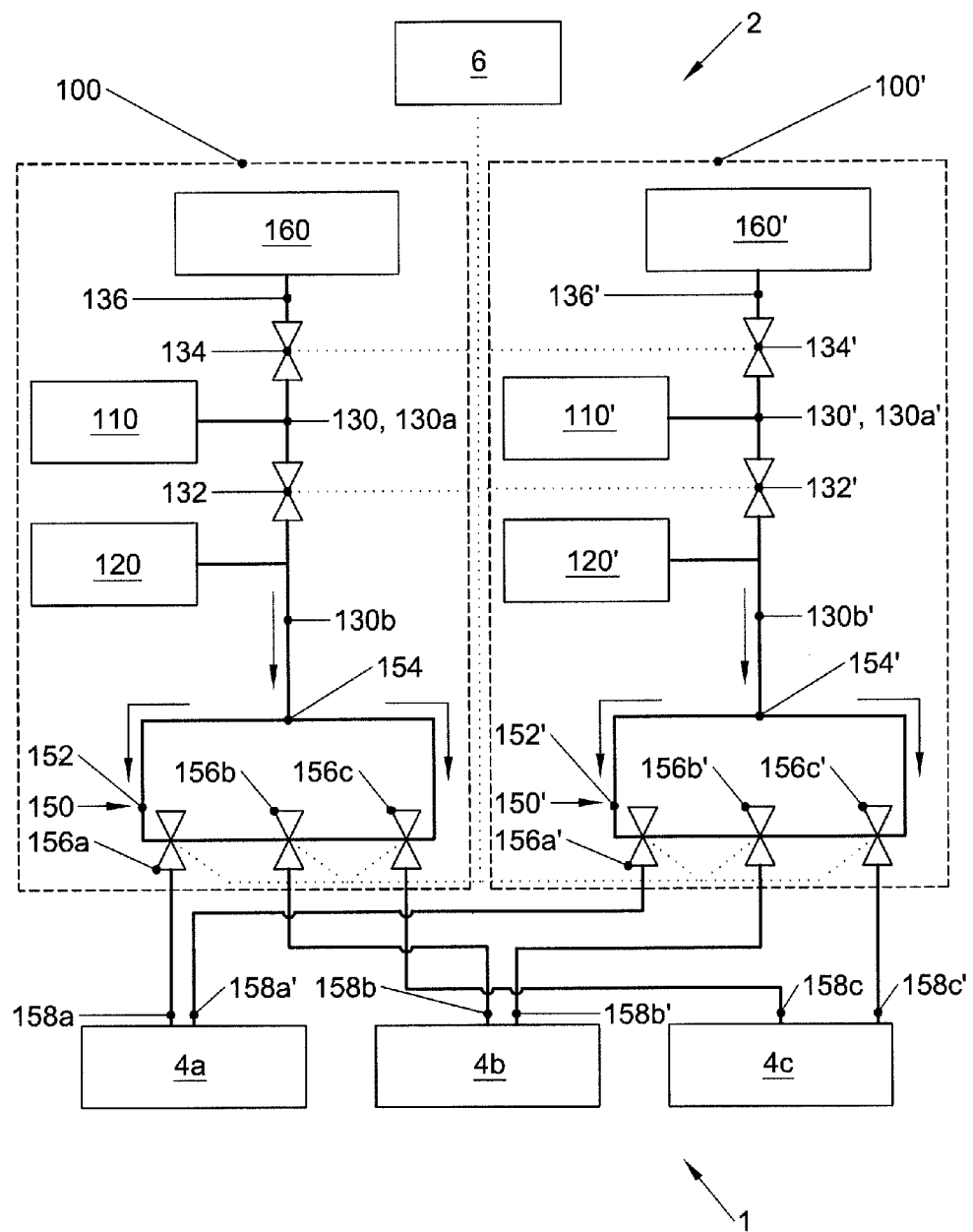
FIG. 3 schematically illustrates a piping diagram of a second exemplary embodiment of a semiconductor processing apparatus according to the present invention, including three reactors and a shared gas supply system including two gas supply units for selectively supplying two process gases to said reactors.

FIG. 3 schematically illustrates a piping diagram of a semiconductor processing apparatus 1 including three reactors 4a-c, and a second exemplary embodiment of a gas supply system 2 according to the present invention including two gas supply units 100, 100'. The two gas supply units 100, 100' may be structurally identical to the gas supply unit 100 discussed above with reference to FIG. 2, and each be configured to selectively supply a respective process gas from a respective process gas source 110, 110' to the plurality of reactors 4a-c via a respective gas distribution manifold 150, 150'. The gas supply system 2 of FIG. 3 may be particularly useful for CVD, and specifically ALD, processes wherein two process gases are used. It will be clear that, in principle, any number of gas supply units 100, 100', etc., may be combined into a gas supply system 2 in order to selectively supply a plurality of reactors 4a-c with multiple different process gases.

In an embodiment, the gas supply system 2 according to the present invention may include a controller 6 that is operably connected to some or all controllable components of the gas supply system 2, including in particular the controllable valves thereof, such as the first and second process gas supply switching valves 132, 132', 134, 134' and the valved outlets 156a-c, 156a'-c', and any other flow control devices that may have been provided to control the flows of process gas and purge gas. The controller 6 may be configured to control the operation of the gas supply system 2 to effect the selective supply of process gas(es) to the respective reactors 4a-c of the apparatus 1 according to a certain process gas supply scheme.

By way of example, two such process gas supply schemes will now be described with reference to FIGS. 4 and 5. Both schemes may be implemented by the controller 6 of the gas supply system 2 shown in FIG. 3, and be particularly useful in ALD processing, which may require sequential and alternating pulses of two process gases to be supplied to the respective reactors 4a-c of the semiconductor processing apparatus 1. In the process gas supply scheme of FIG. 4 the three reactors 4a-c are in turn supplied with a sequence of sequential process gas pulses, wherein the pulses of a respective sequence are alternately supplied by the first and the gas supply unit 100, 100'. Accordingly, the controller 6 may be configured to repeatedly execute an operational cycle, i.e. the repetitive building block of the process gas supply scheme, which may comprise a plurality of successive periods $P_1$, $P_2$, $P_3$, one for each reactor 4a-c. Each reactor 4a-c of the semiconductor processing apparatus 1 may be exclusively associated with one of said periods $P_1$-$P_3$ and vice versa (such that a one-to-one relationship exists between reactors and periods), and during a respective period $P_1$-$P_3$, the two gas supply units 100, 100' of the gas supply system 1 may be controlled to selectively and alternately supply the reactor 4a-c associated with the respective period with process gas.

During the first period $P_1$ of the operational cycle, for instance, the controller 6 may open the valved outlets 156a, 156a' of both gas supply units 100, 100' for the supply of process gas from the respective process gas sources 110, 110' to reactor 4a. The other valved outlets 156b-c and 156b-c' may be closed. The controller 6 may then supply a sequence of process gas pulses from the sources 110 and 110' to the reactor 4a by repeatedly and alternately opening and closing the first gas supply switching valves 132, 132'. During this (entire) sequence of process gas pulses, continuous flows of purge gas may be supplied to reactor 4a from both purge gas sources 120, 120' of the gas supply units 100, 100'. The first period $P_1$ may be followed by a second period $P_2$ and a third period $P_3$. Control of the valves of the gas supply units 100, 100' during periods $P_2$ and $P_3$ may be similar to that during period $P_1$, with the understanding respectively reactors 4b and 4c instead of reactor 4a are to be provided with process and purge gas. Thus, during the second period $P_2$ of the operational cycle, the valved outlets 156b, 156b' of both gas supply units 100, 100' may be open for the supply of process gas from the respective process gas sources 110, 100' to reactor 4b, while the valved outlets 156a,c and 156a',c' may be closed. And similarly, during the third period $P_3$ of the operational cycle, the valved outlets 156c, 156c' of both gas supply units 100, 100' may be open for the supply of process gas from the respect process gas sources 100, 100' to reactor 4c, while the valved outlets 156a-b and 156a-b may be closed.

In particular in the case of ALD, a duration of an individual process gas pulse may preferably be chosen to ensure saturation of a surface of the substrates to be processed therewith. A time interval between successive pulses to a certain reactor 4a-c may preferably be chosen such that a reactor inlet 158a-c, 158a'-c' of a respective gas supply unit 100, 100' to the reactor 4a-c is sufficiently purged from process gas by the time process gas is supplied to that reactor 4a-c via the reactor inlet 158a'-c', 158a-c of the other gas supply unit 100', 100, such that the first and second process gases remain sufficiently separated.

Figure 4:
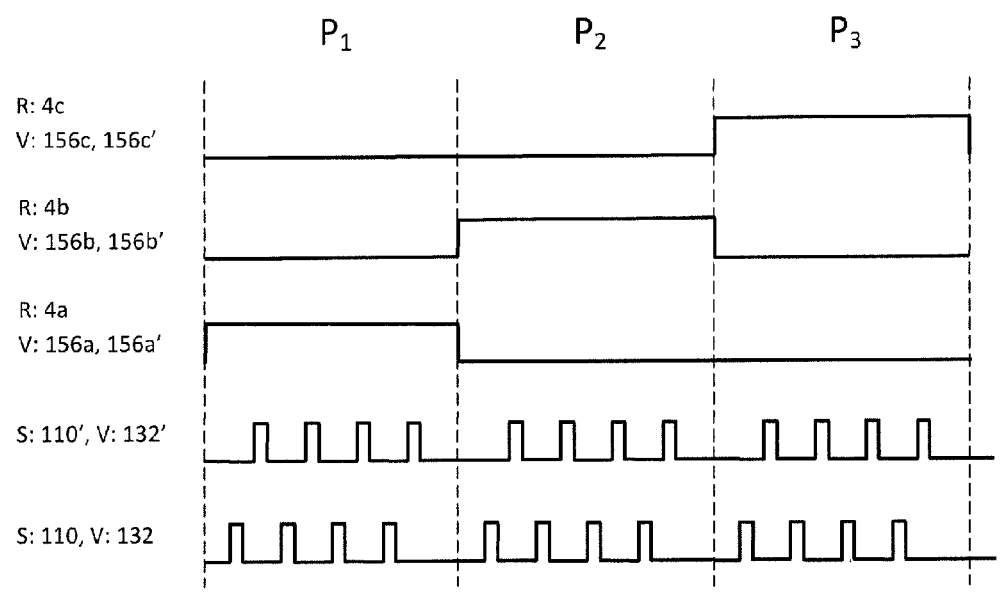
FIGS. 4 and 5 schematically illustrate exemplary process gas supply schemes according to which the shared gas supply system of the semiconductor processing apparatus shown in FIG. 3 may supply process gas to the apparatus' reactors.

In the scheme of FIG. 4 the presence of three reactors is assumed, but it is understood that a different number N of reactors may be present. In that case an operational cycle may comprise N successive periods, $P_1, P_2, P_3, \ldots, P_N$. Further, for instance in case a single operational cycle corresponds to the deposition of a single atomic layer in an ALD process, it will be clear that the operational cycle, comprising periods $P_1$-$P_N$, may be repeated K times to achieve a desired film thickness.

Figure 5:
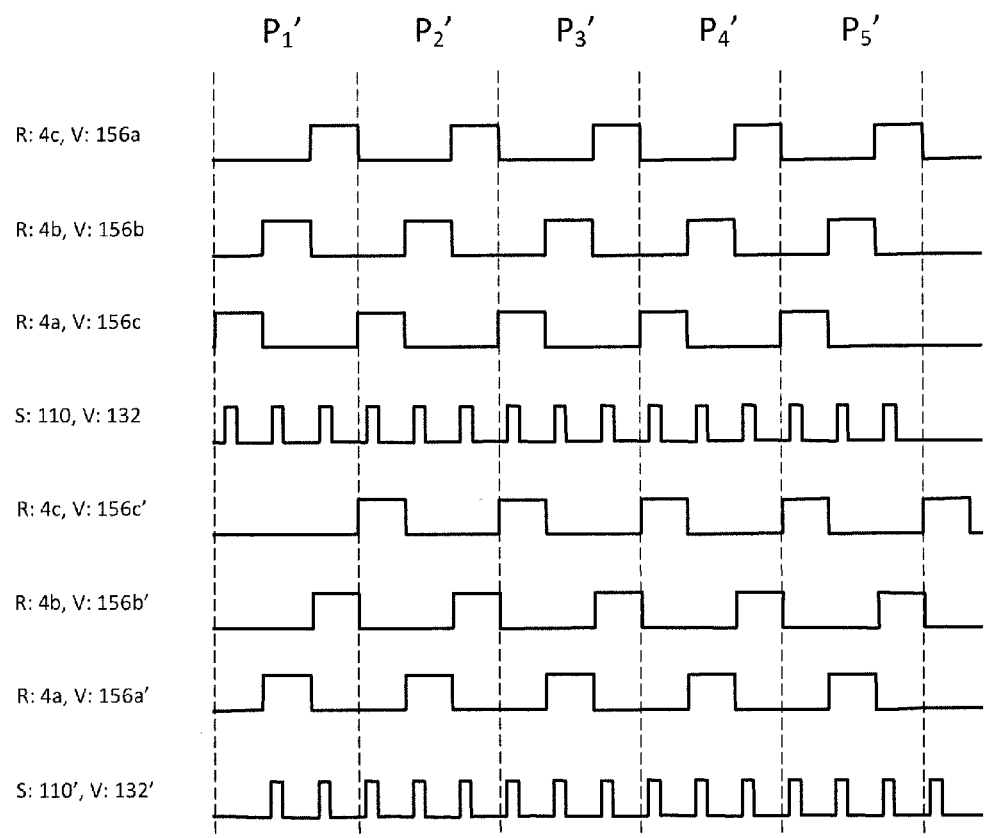

FIG. 5 illustrates another process gas supply scheme that is more efficient than that shown in FIG. 4. Where the scheme of FIG. 4 entails sequentially providing different reactors 4a-c with a sequence of alternating first and second process gas pulses, the scheme of FIG. 5 entails providing different reactors 4a-c with a sequence of alternating first and second process gas pulses in parallel. Here, 'in parallel' may be construed to mean that any two consecutive process gas pulses supplied by a respective gas supply unit 100, 100' are provided to different reactors 4a-c.

To execute the scheme of FIG. 5, the controller 6 may be configured to repeatedly execute an operational cycle comprising a single period, e.g. $P_2'$, $P_3'$, $P_4'$, or $P_5'$ (note that $P_1'$ is depicted as a start-up period that is not to be executed repetitively; the same applies to the last period that is non-labelled and depicted only partially), during which each gas supply unit 100, 100' alternatingly supplies process gas to each of the reactors 4a-c, such that each of the reactors 4a-c is alternatingly supplied with process gases from the respective gas supply units 100, 100' during said period. In an advantageous embodiment, the timing of the process gas pulses may be such that different reactors 4a-c are simultaneously supplied with process gases from different gas supply units 100, 100' during at least a portion of the operational cycle/period; that is, simultaneously with the supply of process gas from one gas supply system 100, 100' to one reactor 4a-c, gas from another gas supply system 100, 100' may be supplied to another reactor 4a-c.

More specifically, during each operational cycle $P_2'$-$P_5'$ the controller 6 may control the first gas supply unit 100 to provide a sequence of first process gas pulses, and cause these pulses to be alternatingly supplied to the respective reactors 4a-c. To this end, it may repeatedly and alternately open and close a respective one of the valved outlets 156a-c and, whenever the respective valved outlet 156a-c is open, additionally open the first gas supply switching valve 132. Simultaneously, the controller 6 may control the second gas supply unit 100' to provide a sequence of second process gas pulses, and cause these pulses to be alternatingly supplied to the respective reactors 4a-c. To this end, it may repeatedly and alternately open and close a respective one of the valved outlets 156a'-c' and, whenever the respective valved outlet 156a'-c' is open, additionally open the second process gas supply switching valve 132'. As before, it is understood that purge gas may be supplied to any of the reactors 4a-c whenever the associated valved outlets 156a-c, 156a'-c' are open.

Again, a duration of an individual process gas pulse may preferably be chosen to ensure saturation of a surface of the substrates to be processed therewith. And a time interval between successive pulses to a certain reactor 4a-c may preferably be chosen such that an reactor inlet 158a-c, 158a'-c' of a respective gas supply unit 100, 100' to the reactor 4a-c is sufficiently purged from process gas by the time process gas is supplied to that reactor 4a-c via the reactor inlet 158a'-c', 158a-c of the other gas supply unit 100', 100, such that the first and second process gases remain sufficiently separated.

Although in the scheme of FIG. 5 only four operational cycles $P_2'$, $P_3'$, $P_4'$, $P_5'$ are shown, it will be clear that the operational cycle may be repeated any desired number of M times such that, in case a single operational cycle corresponds to the ALD deposition of a single atomic layer, a desired film thickness can be achieved. Further, in the example of FIG. 5 pulses for three reactors are depicted, but the number of reactors may be any plurality of reactors N.

As can be seen in FIG. 5, the controller 6 may control the first and second gas supply switching valves 132, 132' in sync, while the patterns of opening and closing the valved outlets 156a-c and 156a'-c' of the first and second gas supply units 100, 100', respectively, may be time-shifted relative to each other. This way, each one of the reactors 4a-c, is supplied with alternating process gas pulses from respective gas supply units 100, 100' and each gas supply unit is supplying gas to only one reactor at a time.

In fact, in the schemes of both FIGS. 4 and 5, each gas supply unit 100, 100' supplies process gas only to one reactor 4a-c at a time. This ensures that each reactor 4a-c receives a same amount of process gas during a certain pulse duration, independent of the position at which its reactor inlet 158a-c and associated valved outlet 156a-c connect to the gas distribution conduit. If multiple reactors 4a-c would be simultaneously supplied with process gas from a same gas supply unit 100, 100' during a certain pulse duration, wherein the gas is distributed over the individual reactors, each reactor receiving a fraction of the total gas flow that is controlled by a flow control device, the amounts of gas delivered to the individual reactors might be dependent on their respective distances to the inlet 154 of the gas distribution manifold 150. Accordingly, following the scheme of FIG. 4, 5, the number of reactors 4a-c connected to the gas supply system 2 may be varied as desired without the need to change the topology of the gas distribution manifold 152 and/or selected pulse durations to compensate for any increase of decrease in the number of reactors 4a-c.

Furthermore, in the schemes of both FIGS. 4 and 5, at least one of the valved outlets 156a-c, 156a'-c' of a respective gas supply unit 100, 100' is open at any point in time during the operational cycle. In the depicted embodiments, this is achieved by opening one valved outlet 156a-c, 156a'-c' of a respective gas supply unit 100, 100' once another valved outlet 156a-c, 156a'-'c of the same respective gas supply unit 100, 100' is closed. In an alternative embodiment, a valved outlet 156a-c, 156a'-c' of a certain gas supply unit 100, 100' may be opened just before another valved outlet 156a-c, 156a'-c' of the same respective gas supply unit 100, 100' is closed. In either case, purge gas from the purge gas sources 120, 120' of either gas supply unit 100, 100' may favorably flow continuously.

With regard to the terminology in this text, the following is noted. A statement that 'A is in fluid communication with B' may be construed to mean that fluid is free to flow from A to B, and/or vice versa. A statement that 'A is fluidly connected to B' may be construed to mean that a fluid flow path, for instance defined by a conduit, has been provided between A and B; A, however, need not necessarily be in fluid communication with B, as the fluid flow path may include one or more valves that may be switched into a closed state to obstruct fluid flow along the fluid flow path between A and B. A statement that 'A is (fluidly) communicable with B' may be construed to mean that A is fluidly connected to B, and that at least one controllable valve has been provided in the fluid flow path between A and B, such that A may alternatively be brought into and out of fluid communication with B.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

LIST OF ELEMENTS 1 semiconductor processing apparatus
2 gas supply system
4a,b,c reactor
6 controller
100 gas supply unit
110 process gas source
120 purge gas source
130 gas supply conduit
130a,b upstream (a) and downstream (b) stage of gas supply conduit
132 first gas supply switching valve
134 second gas supply switching valve
136 exhaust conduit
150 gas distribution manifold
152 gas distribution conduit
154 inlet
156a,b,c valved outlet
158a,b,c reactor inlet
160 exhaust
FIGS. 4 and 5:
R reactor
S process gas source
V valve

We claim:

1. A semiconductor processing apparatus, comprising:
a gas supply system, comprising at least one gas supply unit including:
a process gas source;
a gas distribution manifold comprising:
a plurality of valves, each valve having two valve inlets and one valve outlet, wherein each valve inlet of each valve is connected via a conduit branch to one of the two valve inlets of a neighbouring valve of the plurality of valves to provide a closed loop ring conduit including the conduit branches and the valves that are serially connected within the closed loop ring conduit via the respective valve inlets thereof and conduit branches,
wherein the closed loop ring conduit has an inlet, and wherein the valve outlet of each valve defines an outlet of the gas distribution manifold; and
a gas supply conduit fluidly connecting the process gas source to the inlet of the closed loop ring conduit;
wherein the semiconductor processing apparatus additionally comprises:
a plurality of reactors, each reactor being fluidly connected to a respective outlet of the gas distribution manifold of the at least one gas supply unit, such that process gas from the process gas source of the at least one gas supply unit is selectively suppliable to a respective reactor of said plurality of reactors via the gas supply conduit, the gas distribution manifold, and said outlet of the gas distribution manifold of the at least one gas supply unit.

2. The semiconductor processing apparatus according to claim 1, wherein at least one of the outlets of the gas distribution manifold includes a zero dead volume valve, having substantially no dead volume in the gas distribution manifold upstream of a switching point for the zero dead volume valve.

3. The semiconductor processing apparatus according to claim 1, wherein the gas supply conduit includes an upstream stage and a downstream stage, and
wherein the upstream stage is fluidly connected to the downstream stage through a first gas supply switching valve, such that process gas from the process gas source is suppliable to the reactors only in case the first gas supply switching valve is in an open state.

4. The semiconductor processing apparatus according to claim 3, wherein said first gas supply switching valve is a zero dead volume valve, having substantially no dead volume in the downstream stage of the gas supply conduit downstream of a switching point for the zero dead volume valve.

5. The semiconductor processing apparatus according to claim 3, further including: a purge gas source that is fluidly connected to the downstream stage of the gas supply conduit.

6. The semiconductor processing apparatus according to claim 3, further including:
an exhaust; and
a gas exhaust conduit, having an upstream end that is fluidly connected to the upstream stage of the gas supply conduit through a second gas supply switching valve, and a downstream end that is fluidly connected to the exhaust.

7. The semiconductor processing apparatus according to claim 1, wherein the gas supply system comprises at least two gas supply units, such that
process gas from a process gas source of a first of said at least two gas supply units is selectively suppliable to a respective reactor of said plurality of reactors via the gas supply conduit, the gas distribution manifold, and a respective outlet of said first of said at least two gas supply units, while process gas from a process gas source of a second of said at least two gas supply units is selectively suppliable to a respective reactor of said plurality of reactors via the gas supply conduit, the gas distribution manifold, and a respective outlet of said second of said at least two gas supply systems.

8. The semiconductor processing apparatus according to claim 7, wherein said gas supply system further comprises: a controller that is configured to control the operation of the at least two gas supply units, and is operably connected to at least the outlets of said gas supply units.

9. The semiconductor processing apparatus according to claim 8, wherein said controller is configured to: repeatedly execute an operational cycle comprising a plurality of successive periods, wherein each reactor is exclusively associated with one of said periods of the operational cycle and vice versa, and wherein, during a respective period, the at least two gas supply units of the gas supply system selectively and alternately supply the reactor associated with said respective period with process gas.

10. The semiconductor processing apparatus according to claim 9, wherein at least one of the outlets of each of said at least two gas supply units is open at substantially any point in time during the operational cycle.

11. The semiconductor processing apparatus according to claim 8, wherein said controller is configured to:
to repeatedly execute an operational cycle during which
each one of the reactors is supplied with alternating process gas pulses from the respective gas supply units,
each gas supply unit supplies process gas to only one reactor at a time, and
any two consecutive process gas pulses provided by a respective gas supply unit are supplied to different reactors.

12. The semiconductor processing apparatus according to claim 11, wherein a timing of the process gas pulses is such that one reactor is supplied with process gas from one gas supply unit and simultaneously another reactor is supplied with process gas from another gas supply unit during at least a portion of the operational cycle.

13. The semiconductor processing apparatus according to claim 8, wherein said controller is configured to repeatedly execute an operational cycle during which each one of the reactors is supplied with process gas pulses from the respective gas supply units,
wherein a timing of the process gas pulses is such that different reactors are simultaneously supplied with process gas from different gas supply units during at least a portion of the operational cycle.

14. A gas supply system for use in a semiconductor processing apparatus comprising at least one gas supply unit including:
a process gas source;
a gas distribution manifold comprising:
a plurality of valves, each valve having two valve inlets and one valve outlet, wherein each valve inlet of each valve is connected via a conduit branch to one of the two valve inlets of a neighbouring valve of the plurality of valves to provide a closed loop ring conduit including the conduit branches and the valves that are serially connected within the closed loop ring conduit via the respective valve inlets thereof and conduit branches,
wherein the closed loop ring conduit has an inlet, and
wherein the valve outlet of each valve defines an outlet of the gas distribution manifold; and
a gas supply conduit fluidly connecting the process gas source to the inlet of the closed loop ring conduit;
said at least one gas supply unit being configured such that process gas from the process gas source is selectively suppliable to a respective reactor of a plurality of reactors via the gas supply conduit, the gas distribution manifold, and said outlet of the gas distribution manifold of the at least one gas supply unit, wherein each reactor of the plurality of reactors being fluidly connected to an outlet of the gas distribution manifold.

* * * * *